(12) United States Patent
Pilly et al.

(10) Patent No.: US 11,907,815 B1
(45) Date of Patent: Feb. 20, 2024

(54) SYSTEM AND METHOD FOR IMPROVED GENERALIZATION FROM CONCEPT CONSTRAINED DREAMS

(71) Applicant: HRL Laboratories, LLC, Malibu, CA (US)

(72) Inventors: Praveen K. Pilly, West Hills, CA (US); Nicholas A. Ketz, Topanga, CA (US); Michael D. Howard, Westlake Village, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 102 days.

(21) Appl. No.: 17/590,726

(22) Filed: Feb. 1, 2022

Related U.S. Application Data

(63) Continuation-in-part of application No. 16/900,145, filed on Jun. 12, 2020, now Pat. No. 11,420,655.

(Continued)

(51) Int. Cl.
*B60W 60/00* (2020.01)
*B60W 40/08* (2012.01)
(Continued)

(52) U.S. Cl.
CPC ......... *G06N 20/00* (2019.01); *G06F 18/2148* (2023.01); *G06F 18/2185* (2023.01); *G06F 30/20* (2020.01)

(58) Field of Classification Search
CPC .. B60W 40/09; B60W 60/0054; B60W 50/14; B60W 50/08; G06N 3/0454;
(Continued)

(56) References Cited

U.S. PATENT DOCUMENTS 9,785,145 B2 10/2017 Gordon et al.
11,436,484 B2 * 9/2022 Farabet ............... G06V 10/764
(Continued)

FOREIGN PATENT DOCUMENTS

CN 106740114 A 5/2017
CN 106740114 A * 5/2017 ............ B60K 35/00
(Continued)

OTHER PUBLICATIONS

Ketz, N., Kolouri, S., & Pilly, P. (2019). Using World Models for Pseudo-Rehearsal in Continual Learning. ArXiv:1903.02647 [Cs, Stat], pp. 1-16.

(Continued)

*Primary Examiner* — Yuri Kan
(74) *Attorney, Agent, or Firm* — TOPE-MCKAY & ASSOCIATES

(57) ABSTRACT

Described is a system for improving generalization of an agent, such as an autonomous vehicle, to unanticipated environmental changes. A set of concepts from the agent's experiences of an environment are extracted and consolidated into an episodic world model. Using the episodic world model, a dream sequence of prospective simulations, based on a selected set of concepts and constrained by the environment's semantics and dynamics, is generated. The dream sequence is converted into a sensor data format, which is used for augmented training of the agent to operate in the environment with improved generalization to unanticipated changes in the environment.

18 Claims, 10 Drawing Sheets

Related U.S. Application Data

(60) Provisional application No. 63/146,314, filed on Feb. 5, 2021, provisional application No. 62/906,269, filed on Sep. 26, 2019.

(51) Int. Cl.
*G06N 20/00* (2019.01)
*G06F 30/20* (2020.01)
*G06F 18/214* (2023.01)
*G06F 18/21* (2023.01)

(58) Field of Classification Search
CPC .......... G06N 3/04; G06N 20/00; G06N 20/10; G06K 9/6262; B60K 31/00; B60K 35/00; B60K 31/0008; G06F 17/50; G06F 16/2457; G06V 40/165; G06V 10/764; G05D 1/0088; G06T 7/20
See application file for complete search history.

(56) References Cited

U.S. PATENT DOCUMENTS

| | | | | |
|---|---|---|---|---|
| 2011/0081073 | A1* | 4/2011 | Skipper | G06K 9/6262 382/159 |
| 2018/0118219 | A1 | 5/2018 | Hiei et al. | |
| 2020/0111011 | A1* | 4/2020 | Viswanathan | G06N 20/10 |
| 2020/0151562 | A1* | 5/2020 | Pietquin | G06N 3/0454 |
| 2020/0293064 | A1* | 9/2020 | Wu | G06T 7/20 |
| 2021/0053570 | A1* | 2/2021 | Akella | G05D 1/0088 |
| 2021/0061298 | A1* | 3/2021 | Balachandran | B60W 60/0054 |
| 2021/0101619 | A1* | 4/2021 | Weast | G06F 16/2457 |
| 2021/0284173 | A1* | 9/2021 | Ohnishi | B60W 50/14 |

FOREIGN PATENT DOCUMENTS

| | | | | |
|---|---|---|---|---|
| CN | 110222406 | A | | 9/2019 |
| CN | 110222406 | A * | 9/2019 | ............. G06F 17/50 |
| DE | 102014224765 | A1 | | 6/2016 |
| DE | 102014224765 | A1 * | 6/2016 | ............ G06V 40/165 |
| JP | 2015182526 | A * | 10/2015 | ............ B60W 50/08 |
| JP | 2015182526 | A | | 10/2015 |
| JP | 2018062321 | A | | 4/2018 |
| JP | 2018062321 | A * | 4/2018 | ......... B60K 31/0008 |
| JP | 6520066 | B2 | | 5/2019 |
| JP | 6520066 | B2 * | 5/2019 | ............. B60K 31/00 |
| WO | WO-2016092796 | A1 | | 6/2016 |
| WO | WO-2016092796 | A1 * | 6/2016 | ............ B60W 50/08 |
| WO | WO2019002465 | A1 | | 1/2019 |

OTHER PUBLICATIONS

Kansky K, Silver T, Mély DA, Eldawy M, Lázaro-Gredilla M, Lou X, Dorfman N, Sidor S, Phoenix S, George D. (2017). Schema networks: Zero-shot transfer with a generative causal model of intuitive physics. In Proceedings of the 34th International Conference on Machine Learning—vol. 70, Aug. 6, 2017, pp. 1809-1818.
Kolouri, Soheil, Charles E. Martin, and Heiko Hoffmann (2017). "Explaining distributed neural activations via unsupervised learning." In CVPR Workshop on Explainable Computer Vision and Job Candidate Screening Competition, vol. 2. 2017, pp. 1670-1678.
Liou, Cheng-Yuan; Huang, Jau-Chi; Yang, Wen-Chie (2008). "Modeling word perception using the Elman network". Neurocomputing 71 (2008), pp. 3150-3157.
Merrild, J., Rasmussen, M. A., & Risi, S. (2018). HyperNTM: Evolving scalable neural Turing machines through HyperNEAT. International Conference on the Applications of Evolutionary Computation, pp. 750-766. Springer.
Pilly, P. K., Howard, M. D., & Bhattacharyya, R. (2018). Modeling Contextual Modulation of Memory Associations in the Hippocampus. Frontiers in Human Neuroscience, Nov. 2018, vol. 12, Article 442, pp. 1-20.
Miikkulainen, R., Liang, J., Meyerson, E., Rawal, A., Fink, D., Francon, O., Raju, B., . . . & Hodjat, B. (2019) Evolving Deep Neural Networks, arXiv, 1703.00548, pp. 1-8.
Winih, V., Badia, A.P., Mirza, M., Graves, A., Lillicrap, T., Harley, T., Silver, D. and Kavukcuoglu, K., Jun. 2016, Asynchronous methods for deep reinforcement learning. In International Conference on Machine Learning, pp. 1928-1937, PMLR.
Robins, A., 1995. Catastrophic forgetting, rehearsal and pseudorehearsal. Connection Science, 7(2), pp. 123-146.
Kaiser, L., Babaeizadeh, M., Milos, P., Osinski, B., Campbell, R.H., Czechowski, K., Erhan, D., Finn, C., Kozakowski, P., Levine, S. and Mohiuddin, A., 2019. Model-based reinforcement learning for Atari. arXiv preprint arXiv:1903.00374, pp. 1-28.
Dutordoir, V., Salimbeni, H., Deisenroth, M., & Hensman, J. (2018). Gaussian Process Conditional Density Estimation. ArXiv:1810. 12750 [Cs, Stat], pp. 1-19.
Fawcett, Tom (2006). "An Introduction to ROC Analysis". Pattern Recognition Letters 27 (2006), pp. 861-874. doi:10.1016/j.patrec. 2005.10.010.
Mnih, V, Kavukcuoglu, K, Silver, D, Rusu, A, Veness, J, Bellemare, M, Graves, A, Riedmiller, M, Fidjeland, A, Ostrovski, G, et al. (2015). Human-level control through deep reinforcement learning. Nature, 518(7540): pp. 529-533, 2015.
Notification of Transmittal, the International Search Report, and the Written Opinion of the International Searching Authority for PCT/US2020/037468; dated Sep. 23, 2020.
Brett W Israelsen, et al: "a Dave . . . I can assure you . . . that ita s going to be all right . . . a A Definition, Case for, and Survey of Algorithmic Assurances in Human-Autonomy Trust Relationships," ACM Computing Surveys, ACM, New York, NY, US, vol. 51, No. 6, Jan. 28, 2019 (Jan. 28, 2019), pp. 1-37, XP058426006.
Yunqi Zhao, et al: "Winning Isn't Everything: Enhancing Game Development with Intelligent Agents," arxiv.org, Cornell University Library, 201 OLIN Library Cornell University Ithaca, NY 14853, Mar. 25, 2019 (Mar. 25, 2019), XP081465577.
Notification of the International Preliminary Report on Patentability Chapter I for PCT/US2020/037468; dated Apr. 7, 2022.
The International Preliminary Report on Patentability Chapter I for PCT/US2020/037468; dated Apr. 7, 2022.
Office Action 1 for U.S. Appl. No. 16/900,145, dated Dec. 29, 2021.
Response to Office Action 1 for U.S. Appl. No. 16/900,145, dated Mar. 29, 2022.
Dutordoir, V., Salimbeni, H., Deisenroth, M., & Hensman, J. (2018). Gaussian Process Conditional Density Estimation. ArXiv:1810. 12750, pp. 1-19.
Fawcett, Tom (2006). "An Introduction to ROC Analysis". Pattern Recognition Letters. 27 (8): pp. 861-874.
Ketz, N., Kolouri, S., & Pilly, P. (2019). Using World Models for Pseudo-Rehearsal in Continual Learning. ArXiv:1903.02647, pp. 1-16.
Kansky K, et. al., (2017). "Schema networks: Zero-Shot Transfer with a Generative Causal Model of Intuitive Physics." In Proceedings of the 34th International Conference on Machine Learning. vol. 70: pp. 1809-1818.
Kolouri, Soheil, Charles E. Martin, and Heiko Hoffmann. (2017). "Explaining Distributed Neural Activations via Unsupervised Learning." In CVPR Workshop on Explainable Computer Vision and Job Candidate Screening Competition, vol. 2, pp. 1670-1678.
Merrild, J., Rasmussen, M. A., & Risi, S. (2018). "HyperNTM: Evolving Scalable Neural Turing Machines through HyperNEAT." International Conference on the Applications of Evolutionary Computation, pp. 750-766.
Daftry, S., Zeng, S., Bagnell, J.A., and Hebert, M. (2016). "Introspective Perception: Learning to Predict Failures in Vision Systems." In 2016 IEEE/RSJ International Conference on Intelligent Robots and Systems (IROS), pp. 1743-1750.
Mnih, V., Kavukcuoglu, K., Silver, D., Rusu, A.A., Veness, J., Bellemare, M.G., Graves, A., Riedmiller, M., Fidjeland, A. K., Ostrovski, G. and Petersen, S. (2015). "Human-Level Control Through Deep Reinforcement Learning." Nature, 518 (7540), pp. 529-533.

(56) References Cited

OTHER PUBLICATIONS

Miikkulainen, R., Liang, J., Meyerson, E., Rawal, A., Fink, D., Francon, O., and Hodjat, B. (2019). "Evolving Deep Neural Networks." In Artificial Intelligence in the Age of Neural Networks and Brain Computing, pp. 293-312.

Pilly, P.K., Howard, M.D., and Bhattacharyya, R. (2018). "Modeling Contextual Modulation of Memory Associations in the Hippocampus." Frontiers in Human Neuroscience, 12, pp. 1-20.

Notice of Allowance for U.S. Appl. No. 16/900,145, dated Apr. 14, 2022.

Notice of Allowance for U.S. Appl. No. 16/900,145, dated Apr. 29, 2022.

\* cited by examiner

SYSTEM AND METHOD FOR IMPROVED GENERALIZATION FROM CONCEPT CONSTRAINED DREAMS

CROSS-REFERENCE TO RELATED APPLICATIONS

The present application is a Continuation-in-Part of U.S. application Ser. No. 16/900,145, filed in the United States on Jun. 12, 2020, entitled, "System and Method for Safety and Efficacy Override of an Autonomous System," which is a Non-Provisional Application of U.S. Provisional Application No. 62/906,269, filed in the United States on Sep. 26, 2019, entitled, "System and Method for Autonomous System Introspection," the entirety of which are incorporated herein by reference.

The present application is also a Non-Provisional Application of U.S. Provisional Application No. 63/146,314, filed in the United States on Feb. 5, 2021, entitled, "System and Method for Improved Generalization from Concept Constrained Dreams," the entirety of which is incorporated herein by reference.

BACKGROUND OF INVENTION

(1) Field of Invention

The present invention relates to a system for training an agent to handle unexpected situations and, more particularly, to a system for training an agent to handle unexpected situations using concept constrained dreaming.

(2) Description of Related Art

Machine learning (IL) systems, or agents, are brittle to environmental changes and cannot generalize far outside their training data. Simulation only trains things that the trainers have conceived. However, the world is complex, and it is impossible to specify all unusual or unexpected situations, referred to as "corner cases". There has been a long-felt need to be able to provide a comprehensive, situation-spanning training set to an ML system to train them to be robust to all situations they may face, but this is impossible in any but the most constrained domains of operation.

Autonomous systems, such as vehicles that operate in the environment, face a complex and ever-changing world with unpredictable combinations of elements, even if the elements are, by themselves, familiar. For example, any human driver would be shocked to suddenly find a person lying in the road. Although they have likely seen people lying down before, and they are familiar with driving on the road, they do not expect to need to be on the lookout for an immobile person on the road, lying down. An autonomous vehicle that has never been trained to expect this is even less capable of reacting appropriately. It might have been trained to expect a painting on a road, such as an iconic bicycle indicating that cyclists share the road. Such paintings can be safely driven over, but this would be an inappropriate response in the case of a human.

Concept constrained dreaming can improve on specified and unspecified corner-cases, requires no apriori knowledge about environment, and can continue to learn from current experiences. Concept constrained dreaming adds to the training set rare situations that have not been anticipated by the system designer ("corner cases"), yet it does not require human intervention in order to generate these cases. The prior art does not adequately solve this need.

The prior art for teaching ML systems to be better able to handle corner cases revolves around ways to automatically mutate real experience into novel cases that are still in the realm of possibility. Previous methods can only create specified variations to improve generalization. One approach is meta-learning systems that generalize across a pre-defined set of tasks. However, this generalization capability has low transfer to corner cases. Another approach is procedural content generation, which sweeps across known task parameters to adapt reality, but this method has low transfer to corner cases, because it produces smooth transformations of real experience, rather than the disruptive, unexpected combinations of experience that create corner cases. A third approach is random offline simulations, in which a generative model augments training data. However, it doesn't support incremental learning, and cannot target corner cases. Finally, schema networks generalize over the causality of pre-defined entities (see Literature Reference No. 2). However, they require high explicit knowledge about the environment and human effort.

Thus, a continuing need exists for training a ML system that is operating in the world such that it can handle unexpected situations that have never been experienced before, resulting in a more robust and reliable ability to perform in the world.

SUMMARY OF INVENTION

The present invention relates to a system for training an agent to handle unexpected situations, and more particularly, to a system for training an agent to handle unexpected situations using concept constrained dreaming. The system comprises one or more processors and a non-transitory computer-readable medium having executable instructions encoded thereon such that when executed, the one or more processors perform multiple operations. The system extracts a set of concepts from an agent's experiences of an environment, the environment having associated semantics and dynamics. The extracted concepts are consolidated into an episodic world model. Using the episodic world model, a dream sequence of prospective simulations comprising a selected set of concepts constrained by the environment's semantics and dynamics is generated. The sensor data format of the dream sequence is used for augmented training of the agent to operate in the environment with improved generalization to unanticipated changes in the environment.

In another aspect, the set of concepts is selected to match concepts activated by an episode of a corner case scenario.

In another aspect, the set of concepts is selected to match concepts activated by an episode of a corner case scenario.

In another aspect, the system iterates through the agent's experiences of the environment and extracts a plurality of concepts. When an extracted concept is a new concept, the new concept is stored, and the episodic world model is trained with the new concept.

In another aspect, the system determines if a dream has been specified, wherein when a dream is specified, the set of concepts to be simulated is input by a user, and wherein when a dream is not specified, the system randomly selects the set of concepts to be simulated. Recursive forward simulations of the selected set of concepts are performed by the episodic world model to generate the dream sequence. The dream sequence is added to a training set, and the agent is trained offline with the training set.

In another aspect, the agent is an autonomous vehicle.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
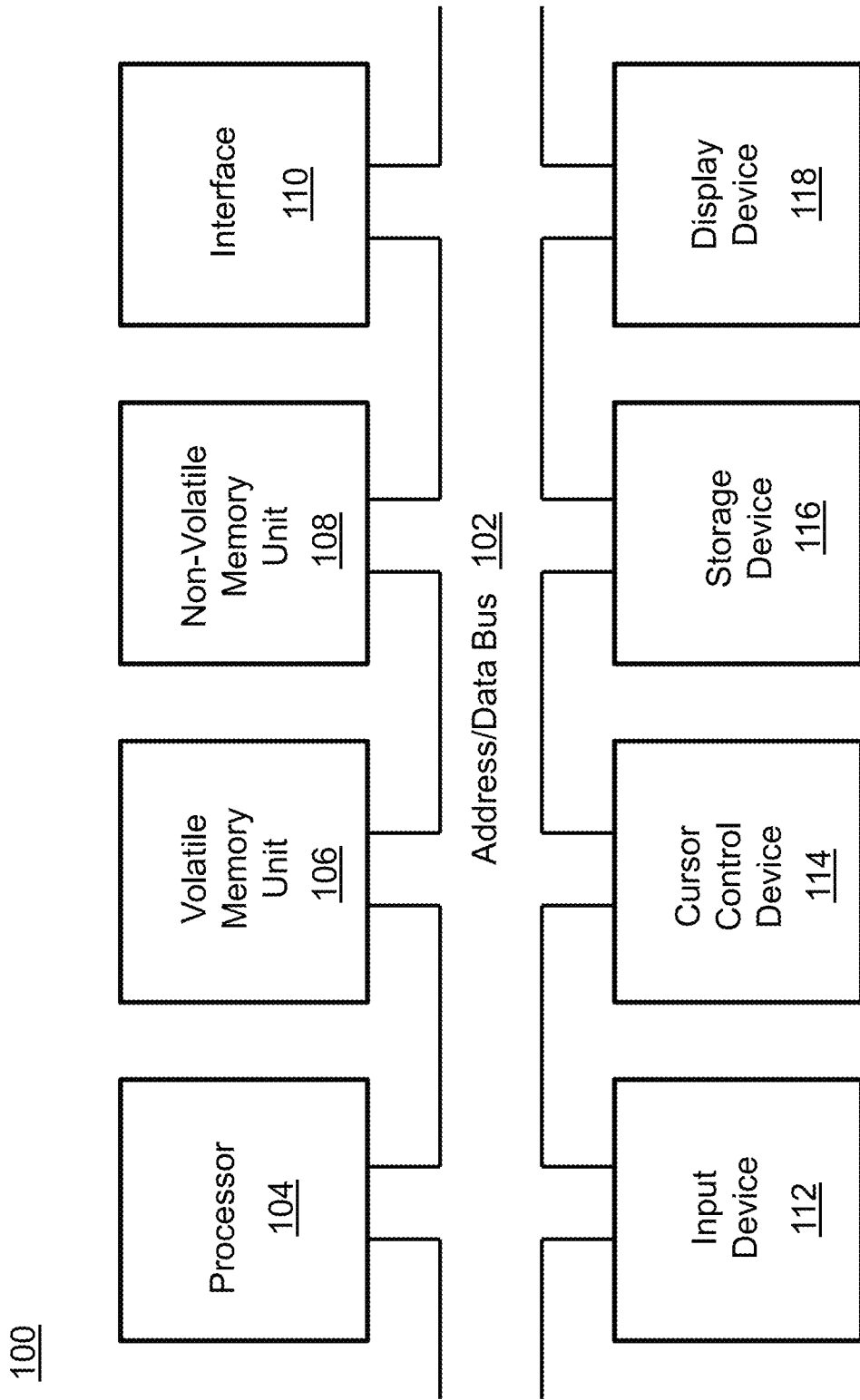
FIG. 1 is a block diagram depicting the components of a system for training a machine learning (ML) system to handle unexpected situations according to some embodiments of the present disclosure.

The present invention relates to a system for training a machine learning (ML) system to handle unexpected situations, and more particularly, to a system for training a ML system to handle unexpected situations using concept constrained dreaming. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent, or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a list of incorporated literature references is provided. Next, a description of the various principal aspects of the present invention is provided. Finally, specific details of various embodiment of the present invention are provided to give an understanding of the specific aspects.

(1) List of Incorporated Literature References

The following references are cited and incorporated throughout this application. For clarity and convenience, the references are listed herein as a central resource for the reader. The following references are hereby incorporated by reference as though fully set forth herein. The references are cited in the application by referring to the corresponding literature reference number, as follows:

1. Ketz, N., Kolouri, S., & Pilly, P. (2019). Using World Models for Pseudo-Rehearsal in Continual Learning. ArXiv:1903.02647 [Cs, Stat].
2. Kansky K, Silver T, Mely D A, Eldawy M, Lizaro-Gredilla M, Lou X, Dorfman N, Sidor S, Phoenix S, George D. (2017). Schema networks: Zero-shot transfer with a generative causal model of intuitive physics. In Proceedings of the 34th International Conference on Machine Learning-Volume 70 2017 Aug. 6 (pp. 1809-1818).
3. Kolouri, Soheil, Charles E. Martin, and Heiko Hoffmann (2017). "Explaining distributed neural activations via unsupervised learning." In CVPR Workshop on Explainable Computer Vision and Job Candidate Screening Competition, vol. 2. 2017.
4. Liou, Cheng-Yuan; Huang, Jau-Chi; Yang, Wen-Chie (2008). "Modeling word perception using the Elman network". Neurocomputing. 71 (16-18): 3150. doi:10.1016/j.neucom.2008.04.030.
5. Merrild, J., Rasmussen, M. A., & Risi, S. (2018). Hyper-NTM: Evolving scalable neural Turing machines through HyperNEAT. International Conference on the Applications of Evolutionary Computation, 750-766. Springer.
6. Pilly, P. K., Howard, M. D., & Bhattacharyya, R. (2018). Modeling Contextual Modulation of Memory Associations in the Hippocampus. Frontiers in Human Neuroscience, 12.

7. Miikkulainen, R., Liang, J., Meyerson, E., Rawal, A., Fink, D., Francon, O., Raju, B., . . . & Hodjat, B. (2019) Evolving Deep Neural Networks, arXiv, 1703.00548.
8. Mnih, V., Badia., AP., Mirza, M., Graves, A., Lillicrap, T., Harley, T., Silver, D. and Kavukcuoglu, K., 2016, June. Asynchronous methods for deep reinforcement learning. In International Conference on Machine Learning (pp. 1928-1937). PMLR.
9. Robins, A., 1995. Catastrophic forgetting, rehearsal and pseudorehearsal. Connection Science, 7(2), pp 123-146.
10. Kaiser, L., Babaeizadeh, M., Milos, P., Osinski, B., Campbell, R. H., Czechowski, K., Erhan, D., Finn, C., Kozakowski, P., Levine, S. and Mohiuddin, A., 2019. Model-based reinforcement learning for Atari. arXiv preprint arXiv:1903.00374.

(2) Principal Aspects

Various embodiments of the invention include three "principal" aspects. The first is a system for training a machine learning (ML) system to handle unexpected situations. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein. In various aspects, the computer system 100 can be embodied in any device(s) that operates to perform the functions as described herein as applicable to the particular application, such as a desktop computer, a mobile or smart phone, a tablet computer, a computer embodied in a mobile platform (e.g., one or more autonomous vehicles), or any other device or devices that can individually and/or collectively execute the instructions to perform the related operations/processes.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
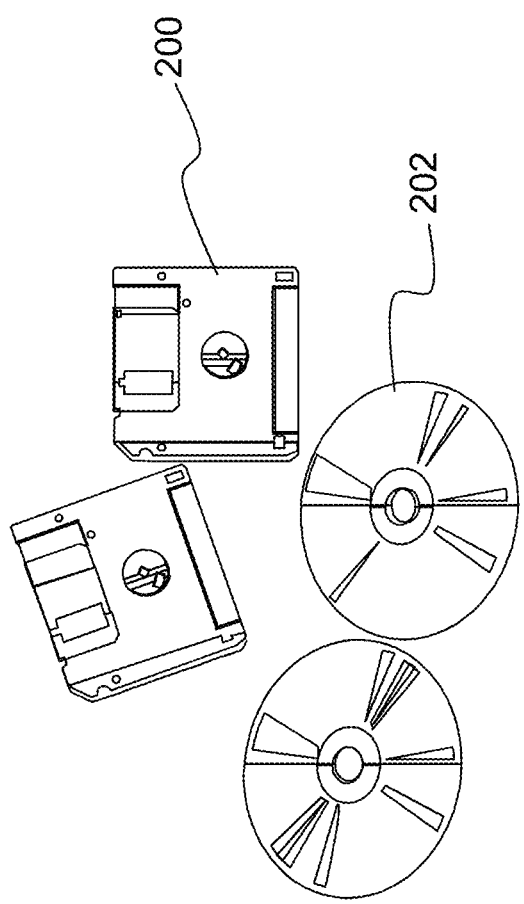
FIG. 2 is an illustration of a computer program product according to some embodiments of the present disclosure.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer and may represent pieces of a whole program or individual, separable, software modules. Non-limiting examples of "instruction" include computer program code (source or object code) and "hard-coded" electronics (i.e., computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(3) Specific Details of Various Embodiments

Described is a system and method for training a machine learning (ML) system, also referred to as an agent, to handle unexpected situations that occur in the world in which the ML system operates. An agent refers to an autonomous entity which acts, directing activity towards achieving goals upon an environment using observation through sensors and actuators, as well as through learning and previous knowledge. In one aspect, the agent is a mobile platform, such as an autonomous vehicle. The ML system is trained through automatic generation of data that is currently under-represented in the training set (referred to as "dreams"), which is driven by novel combinations of learned environment dynamics and concepts to improve on specified and unspecified corner cases. Corner cases (also referred to as failure cases) are rare scenarios that have not been anticipated by the system designer. In the present invention, these scenarios (or corner cases) are added to the training set used to train the ML system that is operating in the real world (e.g., autonomous or semi-autonomous vehicle), reducing the impact of surprising (unanticipated) cases (or situations) and resulting in a more robust and reliable ability to perform and operate in the world (e.g., perform driving maneuvers/vehicular operations in response to the surprising situation). The ML system can be an autonomous system, or any system that operates in the world such as semi-autonomous systems or safety systems. Non-limiting examples of such ML systems include autonomous or semi-autonomous automobiles or airplanes.

Figure 3:
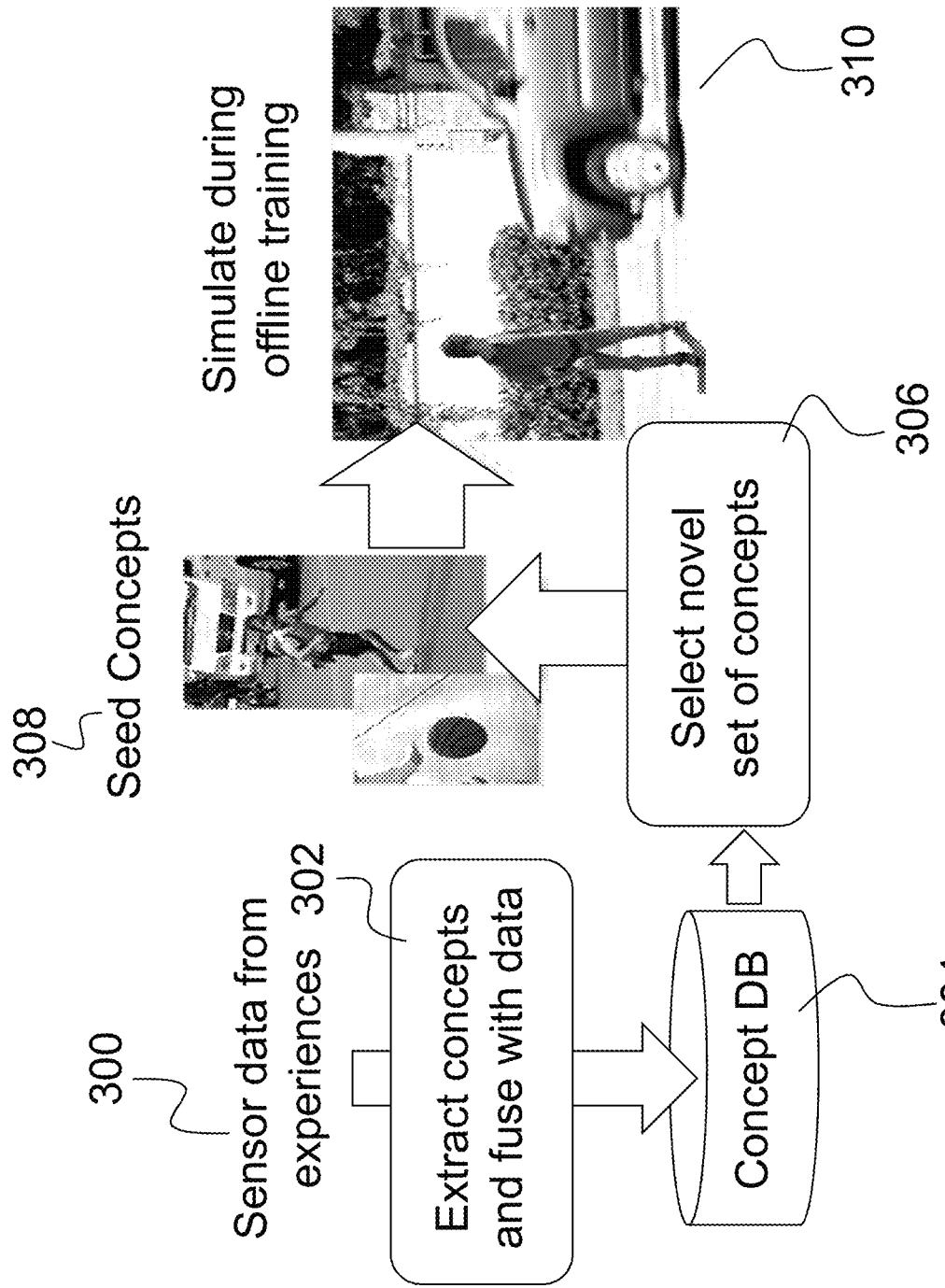
FIG. 3 is a flow diagram illustrating the system flow for training a ML system to handle unexpected situations according to some embodiments of the present disclosure.

FIG. 3 depicts the steps of the approach according to embodiments of the present disclosure. Given sensor data on temporal experiences 300 as input, generalized, semantic concepts (i.e., clusters in high-level features space, which can be semantically interpreted by humans as object, entities, etc.) are extracted in a first step 302 and fused with the sensor data on temporal experiences 300 in a concept database 304. In other words, the concepts are added as inputs additional to the sensor data. The concept database 304 is the training set of sensor data enhanced with extracted concepts, which are themselves extracted from the raw/original training set. The combination of the sensor data and extracted concepts is augmented data that is then provided as input into an episodic world model in order to update the episodic world model, as will be described in detail below. The invention described herein is agnostic to sensor modality. Therefore, for autonomous driving, for example, the inputs can based on a camera, LIDAR, RADAR, etc. Temporal experiences are continuous series of experiences in discrete time. For instance, for a camera-based input, temporal experiences are a series of visual video frames.

By fusing extracted concepts with the experiential data, the invention described herein derives generalization capability, so that the episodic memory network can adapt as new experiences arrive. In a second step 306, a set of concepts that have been under-represented in the training set (a "surprising" corner-case), referred to as seed concepts 308, is selected and added to the training set, to train the agent in an offline period 310. Offline dreams are generated by seeding the system with concepts alone without any sensor data. The under-represented concepts are determined based on relative frequency of the combinations of concepts. For example, an under-represented (corner-case) scenario for autonomous driving could be a kid running onto a suburban street chasing a ball in front of a vehicle. In this case, the unique combination of concepts such as "kid", "suburban street", "ball", "running", etc. may never occur in the training set. The threshold for determining under-represented cases depends on the application and can be set by the end user.

Thus, the system automatically generates offline training data from novel combinations of previously experienced semantic concepts. These novel concept sets seed novel experiences (i.e., the agent dreams of "surprising" corner-cases), giving the agent (i.e., the ML system being trained) experience in dealing with corner cases, which are by definition situations that rarely occur and may not be anticipated by trainers.

Central to the approach described herein is the use of semantic concepts extracted from experiences, which offers the agent (IL system) a generalized experience that can cover many specific situations. A concept can be thought of as a semantic description of an important feature in a scene (e.g., traffic sign, traffic light, wet road surface, parked cars, kid running on the street, ball), but is instantiated as a set of clustered activations in a particular neural network (see Literature Reference No. 3), not a symbolic text label. For the purposes of this disclosure, concepts correspond to the semantic meaning of the prominent object, entity, or high-level features depicted in images. For example, for an autonomous car, the prospect of a child darting out between parked cars into the road is a dangerous, rare experience. Using prior art approaches, a system developer might develop a training set that includes one or more examples of children darting out into the road, but those examples have very specific features. Therefore, the agent (ML system) may learn how to deal with a child running between parked cars but be unable to deal with a child darting out from behind a tree. Previous methods can only create specified variations beyond training to improve generalization. In contrast, the system according to embodiments of the present disclosure fuses these generalized, semantic concepts of a child on the road, together with other semantic concepts that have never been experienced together, such as a ball and a child, or a man lying on the road with a big bird on top of him.

In use, a corner case (or failure case) is identified in the field and analyzed within the trained system according to embodiments of the present disclosure. A set of existing concepts sufficient to describe the scenario of the corner case are identified and used to simulate scenarios related to the identified corner case. The episodic world model is constrained by the corner case related concepts to generate new data constrained by the environment's semantics and dynamics. For example, during offline training, the "dream" (or self-generated simulation) may start by imagining driving on a tight street with parked cars. Then, a ball rolls out into the street unexpectedly and the agent successfully avoids the ball in the simulation. Kids following the ball in the simulation teach the ML system to slow down instead of swerve. In the present invention, the episodic world model and ML system continue to learn by interleaving simulations of previous experiences to preserve existing knowledge.

Figure 4:
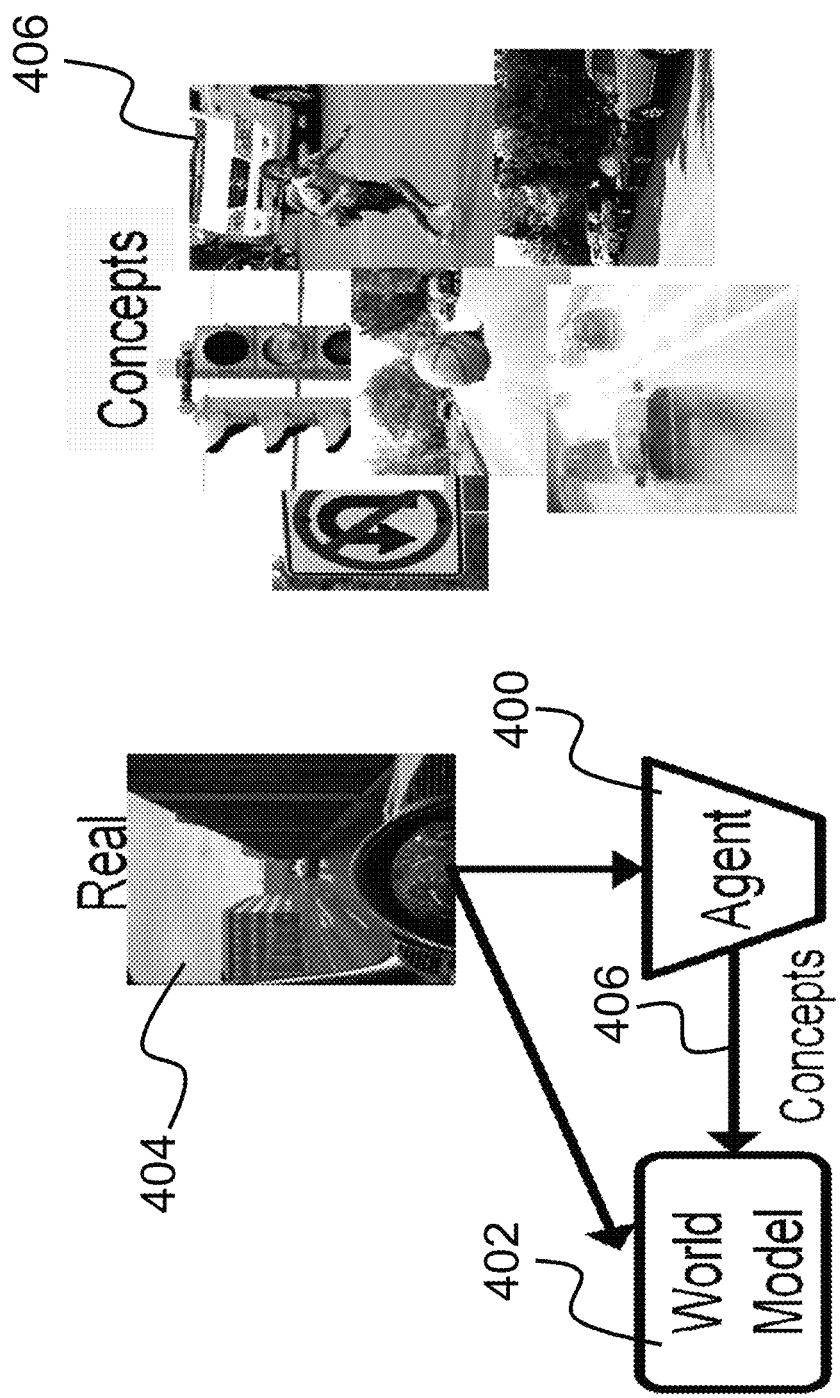
FIG. 4 is an illustration of agent policy and a Episodic World Model learned from exposure to the real environment according to some embodiments of the present disclosure.

FIG. 4 illustrates how a policy network of an agent 400 and an episodic world model 402 are learned from exposure to the real environment 404. A policy network is defined as a neural network that computes discrete/continuous actions to be performed by an agent in response to the current state of the environment. The policy network is trained to produce actions an agent 400 takes based on a latent representation of sensed environmental data. The episodic world model 402 is defined as a neural network that makes temporal predictions of the next state of the environment and the reward the agent would get in response to the current state of the environment and the current action taken by the agent. Concepts 406 are extracted from the agent's 400 learned features and consolidated into the episodic world model 402 for improved predictions and later cueing. The concepts 406 are extracted, clustered, hierarchical patterns of network activity from the policy network.

Figure 5:
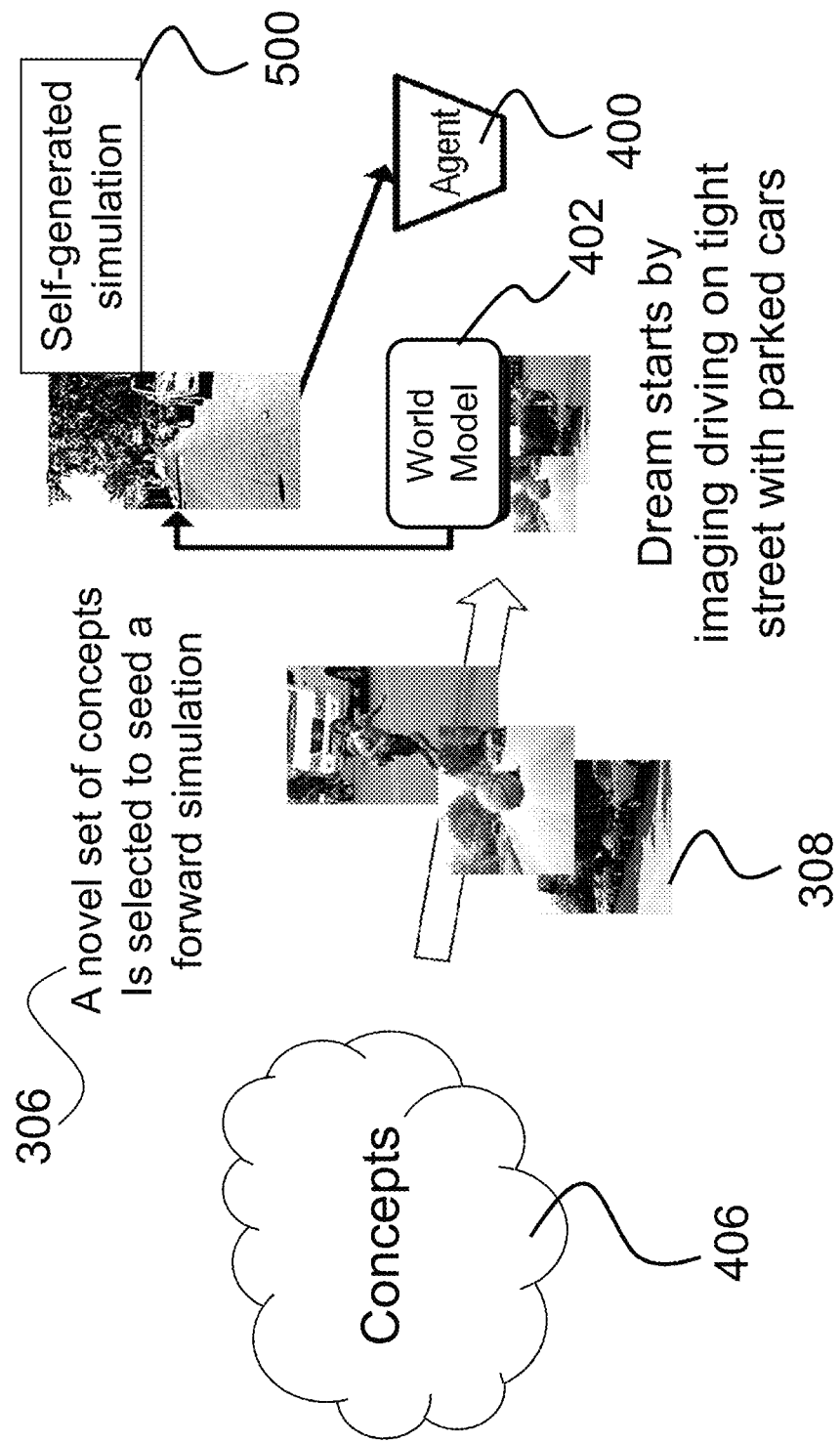
FIG. 5 is an illustration of generating novel experiences that respect the environment's semantics and dynamics according to some embodiments of the present disclosure.

FIG. 5 depicts a novel subset of concepts being selected (the second step 306 in FIG. 3). Concepts 406 are contained or stored in the concept database 304. The novel subset of concepts, or seed concepts 308, are selected for use in generating a novel training example, or dream. For dreaming new experiences related to under-represented situations, the seed concepts 308 are selected from the list of extracted concepts (concept database 304 in FIG. 3 or concept store 602 in FIG. 6). In particular, there are no sensor data during the offline dreaming procedure. The choice of the N concepts to be selected for the novel subset of concepts can be made at random or based on some broad criterion, such as the average number of concepts activated in known rare or corner cases. Alternatively, the choice of the N concepts is made directly by the number of concepts in a particular specified corner case. During offline periods, the seed concepts 308 are selected to seed a forward self-generated simulation 500 (or dream) in order to generate novel experiences that respect the environment's semantics and dynamics.

Figure 6:
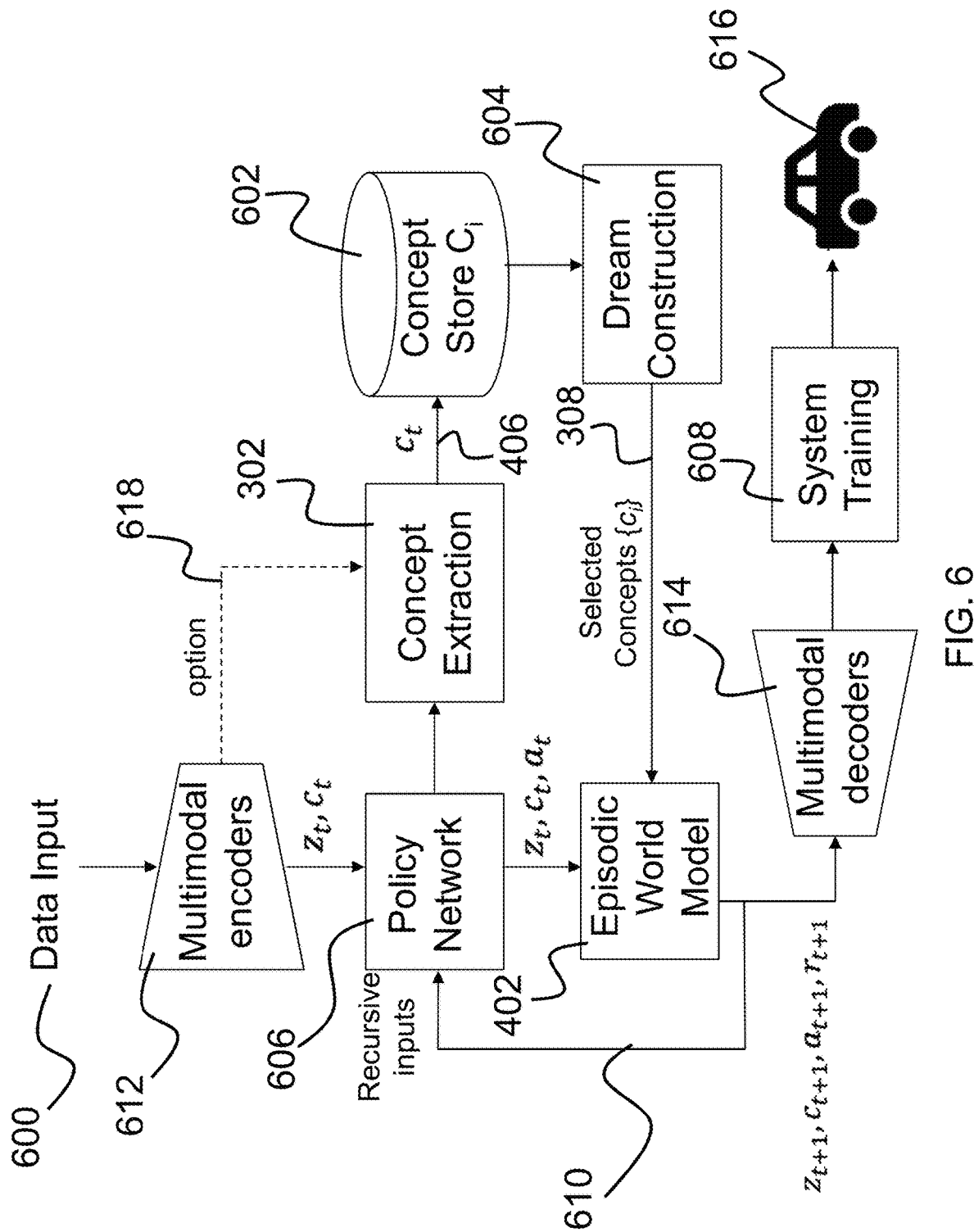
FIG. 6 is a flow diagram illustrating the primary components of the system for training a ML system to handle unexpected situations according to some embodiments of the present disclosure.

FIG. 6 illustrates the primary components of the present invention, including Data Input 600, a Concept Extraction 302 component, a Concept Store 602 component (list of extracted concepts), a Dream Construction 604 component, a Policy Network 606 component, an Episodic World Model 402 component, and a System Training 608 component. The Data Input 600 are either sensor data from the environment or a specifically prepared training set. The Policy Network 606 component is trained to produce actions the ML system 616 takes based on a latent representation of sensed environmental data, or Data Input 600. The Concept Extraction 302 component is capable of extracting clustered, hierarchical patterns of network activity from the Policy Network 606 components, called concepts. The Dream Construction 604 component chooses a subset of concepts, or selected concepts $\{c_i\}$ 308, to use in generating a novel training example ("dream") to train the ML system 616 in offline periods.

The Episodic World Model 402 component (an internal episodic memory model that stores experiences fused with concepts) is capable of storing episodic experiences and generating prospective simulations starting with a set of concepts. The Episodic World Model 402 component, when presented with a set of concepts (without sensor data) will "roll out" a temporal experience that includes the associated extracted concepts, based on its previous training of the dynamics of these concepts when they have been experienced in the past. Thus, the ML system 616 can continue to learn by interleaving (i.e., to arrange in alternate layers) these "dream" simulations with simulations of previous experiences to preserve existing knowledge. If the beginning situation (e.g., time t) is given, the Episodic World Model 402 component will produce the next situation (time t+1), and if the output is recursively provided to the inputs, the temporal progression of the experience will be recalled. This process is referred to as a "prospective simulation".

The System Training 608 component interleaves decoded, generated corner case training experiences with actual experiences in offline periods. The System Training 608 creates alternating learning blocks with dream and real experiences. The number of frames in each learning block is a parameter that the user can adjust to achieve generalization to under-represented situations without forgetting the basic skills or task behaviors that are learned from the real experiences (i.e., regular training set). The simulated dream experience with temporal extent is created by applying the t+1 Episodic World Model 402 component outputs recursively (i.e., recursive inputs 610) back into the Policy Network 606 t inputs. The temporal extent refers to the training set that comprises episodes with more than one frame in sequence. Each of these components will be described in further detail below.

(3.1) Data Input 600

Temporal experiences in the real world are acquired via sensors such as cameras, microphones, global positioning system (GPS), speed sensors (e.g., accelerometers, tachometers), and weather (e.g., temperature, wind speed and direction, barometric pressure, relative humidity) sensors. Alternatively, designers might simulate a training set using recorded or simulated data. In either case, the data is encoded into a compact, efficient, fixed-length vector to input to the Policy Network 606 component. FIG. 6 shows multimodal encoders 612 at the input and multimodal decoders 614 at the output but note that this is a simplification. In actuality, an autoencoder learns to both encode and decode at the same time. Therefore, this is the same autoencoder, using the encoding part for the input and the decoding part for the output, one for each modality. Autoencoders are prior art artificial neural networks used for learning a representation (encoding) for a set of data, typically for the purpose of dimensionality reduction. Autoencoders are well-known to those skilled in the art (see Literature Reference No. 4 of the List of Incorporated Literature References). The encoded data is input to the Policy Network 606 component.

(3.2) Policy Network 606 Component

The Policy Network 606 component is implemented by a state-of-the-art deep actor-critic model (see Literature Reference No. 8), which is a well-known method of reinforcement learning in which the system acts and, based on the resulting reward, a critic system adapts the actor implemented by an evolving recurrent actor-critic network to learn reward-driven actions for various tasks based on situational context and memory recall. The Policy Network 606 is the component that outputs the actions to be performed by the system. Concepts can be extracted from either perception or action modules. The Policy Network 606 can also be optimized using neuroevolutionary techniques for deep networks: CoDeepNEAT (see Literature Reference No. 7) for direct encoding and HyperNEAT (see Literature Reference No. 5) for indirect encoding. The action choice is output to the Episodic World Model 402 component. The Policy Network 606 component is trained to match the actions that the agent takes, given the environmental inputs encoded into a latent state $z_t$ by Multimodal Encoders 612.

The actions the agent can take depends on the environment and domain. For example, for a self-driving operation, the actions (or vehicle operations) that the agent (e.g., autonomous vehicle) can be caused to perform in response to an unanticipated change in the environment can be a combination of acceleration, braking, and steering. Non-limiting examples of autonomous driving functions (or responses) include steering operations, throttle operations to increase or decrease acceleration, braking to bring the autonomous platform to a stop, and vehicle operations that maintain course and speed without change. The responses may be appropriate for avoiding a collision, improving travel speed, or improving efficiency. As can be appreciated by one skilled in the art, each of these driving functions is controlled by one or more vehicle components, such as a braking mechanism, a steering mechanism, suspension, or safety device (e.g., airbags, seatbelt tensioners, etc.).

The training can take place daily, by storing online experiences and then in offline periods asserting $z_t$ at the network input (the encoded data from time t) and the associated action at that the vehicle took at time t at the network output. Concepts 406 are extracted as described below.

(3.3) Concept Extraction 302 Component

Concepts 406 may be extracted either from the autoencoders (e.g., multimodal encoders 612), as indicated by the arrow 618 labeled "option" in FIG. 6, or from the Policy Network 606 component. A non-limiting example of an implementation is to use the Policy Network 606 concepts because the action concepts will be more refined. Extracted concepts 406 are held in the Concept Store 602 component and accessed by the Dream Construction 604 component.

Figure 7:
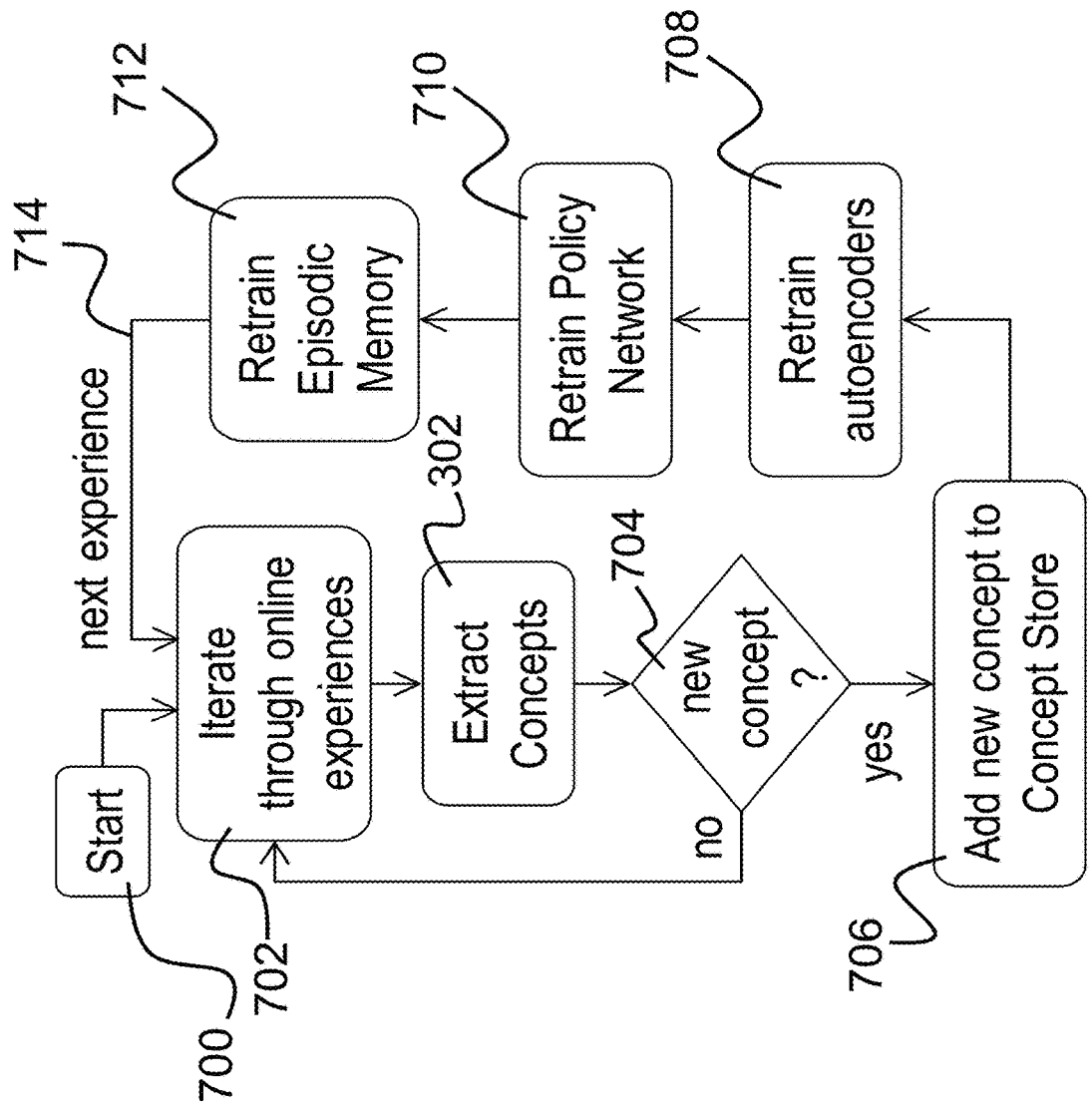
FIG. 7 is a flow diagram illustrating extracting concepts from experience according to some embodiments of the present disclosure.

In one embodiment, the concept extraction technique used is Deep Sense Learning (DSL), which is a prior art system (see Literature Reference No. 3) used to extract and cluster network activities into "concepts" 406, which can be employed as symbolic representations of the inputs that evoked them. These concepts 406 are then fused into the Multimodal Encoders 612 and the Policy Network 606 using prior art offline pseudo-rehearsal techniques (see Literature Reference No. 9). The Episodic World Model 402 component network itself can be updated with the enhanced latent representations (i.e., with the incorporation of new or updated concepts). There is no need for the concepts to be particularly meaningful in a semantic sense to humans; however, since similar (but not identical) inputs can give rise to similar activity clusters, they are used to generalize the encoded sensor data. When a new feature in the environment is different enough that the Concept Extraction 302 component (employing a classification submodule) cannot find a good match in the Concept Store 602 component, a new concept 406 is created and stored, and all networks that depend on the DSL concepts must be retrained and reorganized to incorporate the new concept without forgetting previous ones (autoencoders, Episodic World Model 402 component and Policy Network 606 component). This is done offline using interleaved training with a combination of most recent data and generative data for prior experiences. FIG. 7 illustrates this reorganizing process. Literature Reference No. 3 demonstrated a 42.5% reduction in classification error with incorporation of DSL extracted concepts into a deep network, due to the generalization capability it provides.

FIG. 7 is a flow diagram that illustrates the process of extracting concepts from experiences and retraining all the networks whenever new concepts are discovered. Specifically, FIG. 7 depicts how concepts are extracted in an offline period and any new ones incorporated into the networks. In one embodiment, the ML system 616 has enough storage to store all the experiences while operating online (i.e., during a day of operation). Then, in an offline period (e.g., at night) the ML system 616 replays each of those experiences and extracts concepts. Following start 700, the system described herein iterates through the online experiences 702 and extracts concepts 302. The system then determines if an extracted concept is a new concept 704. If it is not a new concept, the system returns to iterating through the online experiences 702. If the extracted concept is a new concept, the new concept is added to the Concept Store 706 component. Following this addition, autoencoders are retrained 708, the Policy Network component is retrained 710, and the Episodic World Memory 402 component is retrained 712. The system according to embodiments of the present disclosure then goes to the next experience 714 and repeats the process in FIG. 7.

In order to retrain the networks to incorporate new concepts, the raw experiences of the ML system 616 are logged in a first-in, first-out (FIFO) buffer. Then, offline, the autoencoder is updated with the new and prior data. Next, the Policy Network 606 component is re-optimized, using the Policy Network 606 component evolved in the last offline period to seed the networks for a new cycle of neuroevolution. Following this step, concepts are re-extracted. Given that the autoencoder, the Policy Network 606 component, and the concepts 406 have all likely been updated, especially with the content and number of meta-knowledge concepts changing, the Episodic World Model 402 component needs to be re-organized as well, by retraining with the experiences in the memory buffer. This process continues over subsequent online and offline periods, with the expectation that the autoencoder, the Policy Network 606 component, concepts 406, and the Episodic World Model 402 component will eventually stabilize as the core set of experiences and task strategies of the trained agent are explored. However, the present invention is always capable of incorporating any new concepts experienced by the Agent (i.e., ML system 616).

A match between newly extracted concepts and previously extracted concepts in the Concept Store 602 component is evidenced by a low entropy output of a classification network that is a submodule of the Concept Extraction 302 component. A classification network is trained to produce a unique output representing each of the classes (in this case each of the concepts in the Concept Store 602). A low entropy output means that the output class is clearly identified by the network, and a high entropy output means that the output class is unclear from the output values (i.e., the decision network is indecisive).

(3.4) Episodic World Model 402

Figure 8:
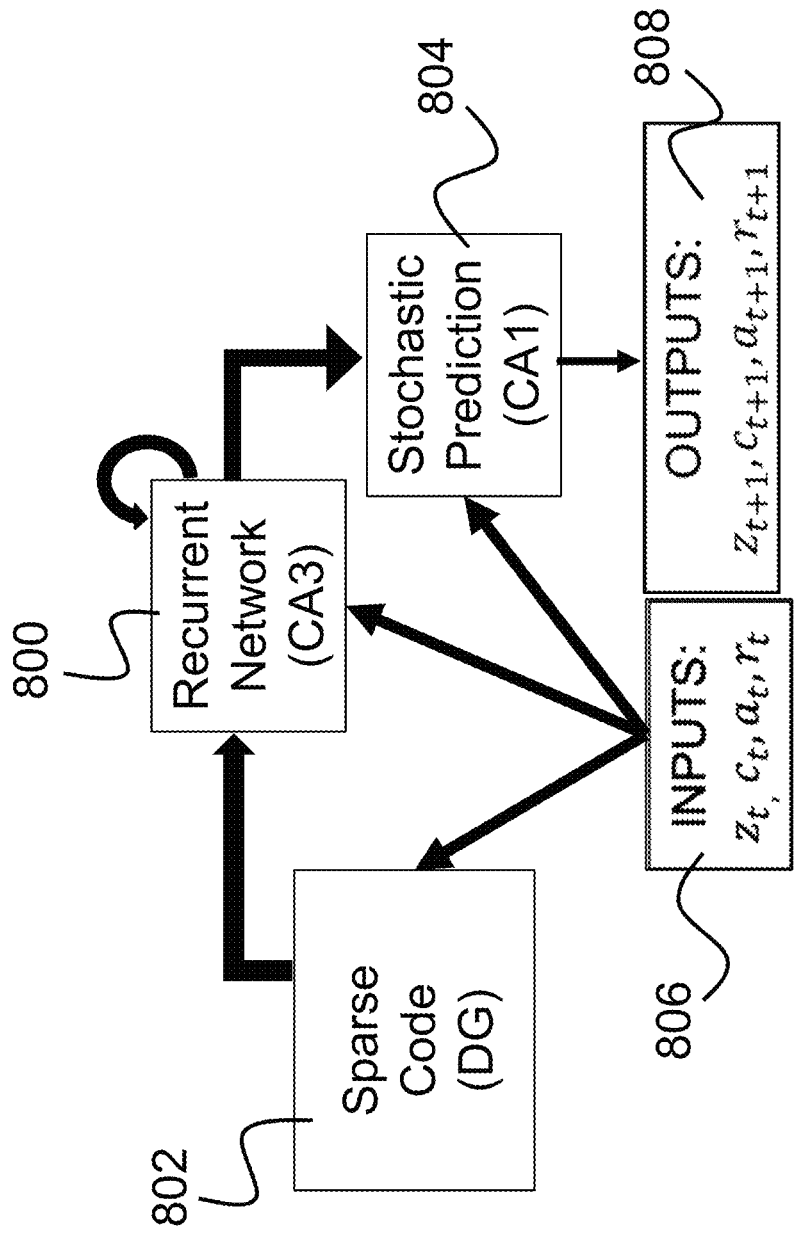
FIG. 8 is an illustration of the Episodic World Model memory according to some embodiments of the present disclosure.

The Episodic World Model 402 is a prior art brain-inspired memory model (described in Literature Reference No. 1), implemented by interconnected recurrent heterogeneous networks with the ability to do prospective temporal simulations through memory based on some given initial conditions. As depicted in FIG. 8, the Episodic World Model 402 component is a heterogeneous network modeled after the CA3 800 and dentate gyrus (DG) 802 circuits in the hippocampus to achieve pattern completion and separation capabilities, respectively (see Literature Reference Nos. 1 and 6).

The Episodic World Model 402 component learns an efficient forward model of world dynamics conditioned by the ML system's 616 actions. World dynamics refers to being able to predict the next state of the environment (i.e., world) given the current state and the current action taken by the system (i.e., agent). The Episodic World Model 402 component predicts the future based on efficiently encoded past experiences. The latent representation conditioned on the current action is used to learn a predictive distribution over possible next states. As shown in FIG. 8, once encoded in the latent space, many prospective simulations can be generated by feeding the stochastic temporal predictions 804 of the Episodic World Model 402 component back on itself. In other words, the outputs 808 become the inputs 806 in the next iteration of the simulation, as described at the end of this paragraph. The Episodic World Model 402 component is implemented by interconnected recurrent heterogeneous networks. The Episodic World Model 402 component is trained with a latent representation ($z_t$) of a temporal sequence of sensed data fused with activated concepts ($c_t$), as well as an action and a reward ($a_t$, $r_t$). The temporal sequence is trained so that given input data from time t, the Episodic World Model 402 component can predict the data from time t+1. After being so trained, the Episodic World Model 402 component can perform a simulated rollout of the experience by using the t+1 outputs as the next input, producing the t+2 outputs, etc.

When an input state is presented along with an associated set of actions (i.e., inputs 806), the Episodic World Model 402 component predicts and outputs 808 the next state, next concepts, next action, and next reward ($z_{t+1}$, $c_{t+1}$, $a_{t+1}$, $r_{t+1}$). The input consists of a low-dimensional latent state representation ($z_t$) of the environment, which typically has >100 times lower dimensionality than the sensor space, a distribution of active concepts $\{c_i\}$ 406 extracted from the Policy Network 606 component, an action the agent takes in such a state ($a_t$), and reward $a_t$ time t ($r_t$). Each rollout operates within the low-dimensional latent space of prior experiences. These experiences are encoded into the Episodic World Model 402.

As described above in section (3.3), concepts $c_t$ 406 are fused into the networks, including the Policy Network 606 and Episodic World Model 402 components. This contributes to a more generalized representation of the world. Critically, it employs the pattern completion capabilities of the Episodic World Model 402 component, making it possible for the Dream Construction 604 component to create a new dream by inputting a novel set of concepts (or seed/selected concepts 308), without the associated latent sensor inputs of the environment ($z_t$), because the Episodic World Model 402 component pattern completes the incomplete input.

Task-specific reward functions generate the rewards, which are moment-by-moment evaluations of the ML system's 616 performance. As a non-limiting example of a reward function for an autonomous driving agent, the rules of driving embodied in driver training courses and manuals can be used to supply a score for safe operation of the vehicle. A more advanced reward function might add goal-oriented rewards (e.g., how efficiently did the vehicle get to a goal location).

Each simulation ("dream") run by the Episodic World Model 402 is K frames long, where K is user-specified to be long enough to capture the training experience. Another decision for the implementer is to decide on the frame rate, or timestepsize. This is a trade-off between adequate resolution to capture the critical aspects of an experience versus capability to accommodate the temporal-spatial extent of the generated experience. Also, M simulations are run, and the output sequences are stored. M is chosen to give the ML system (agent) sufficient experience with each corner case being generated, relative to other experiences the agent has been trained with.

(3.5) Dream Construction 604 Component

The Dream Construction 604 component selects a subset of concepts (seed/selected concepts 308) from the Concept Store 602 component as inputs to the Episodic World Model 402 component. Most simply, the choice can be made at random, perhaps limited by a pre-determined parameter N (see paragraph 00060) defining how many concepts to select at a time. In this case, a validation process would be required to reject concept subsets that are physically impossible (like a flying tree) or have previously been experienced together. Additionally, the pre-determined parameter N would be based on a number of concepts that constitute typical corner cases. A second option is a direct selection of concepts that occur in particular corner cases of interest for which there is very limited training data in the real world (e.g., kids appearing out of nowhere on the road while playing). In this method, the set of concepts is selected to match concepts activated by an episode of a corner case scenario. A source for such a selection of concepts during pre-deployment training to boost generalization to known corner cases would be investigative reports on rare but deadly accidents, such as the National Highway Traffic Safety Administration (NHTSA) reports for autonomous driving.

Figure 9:
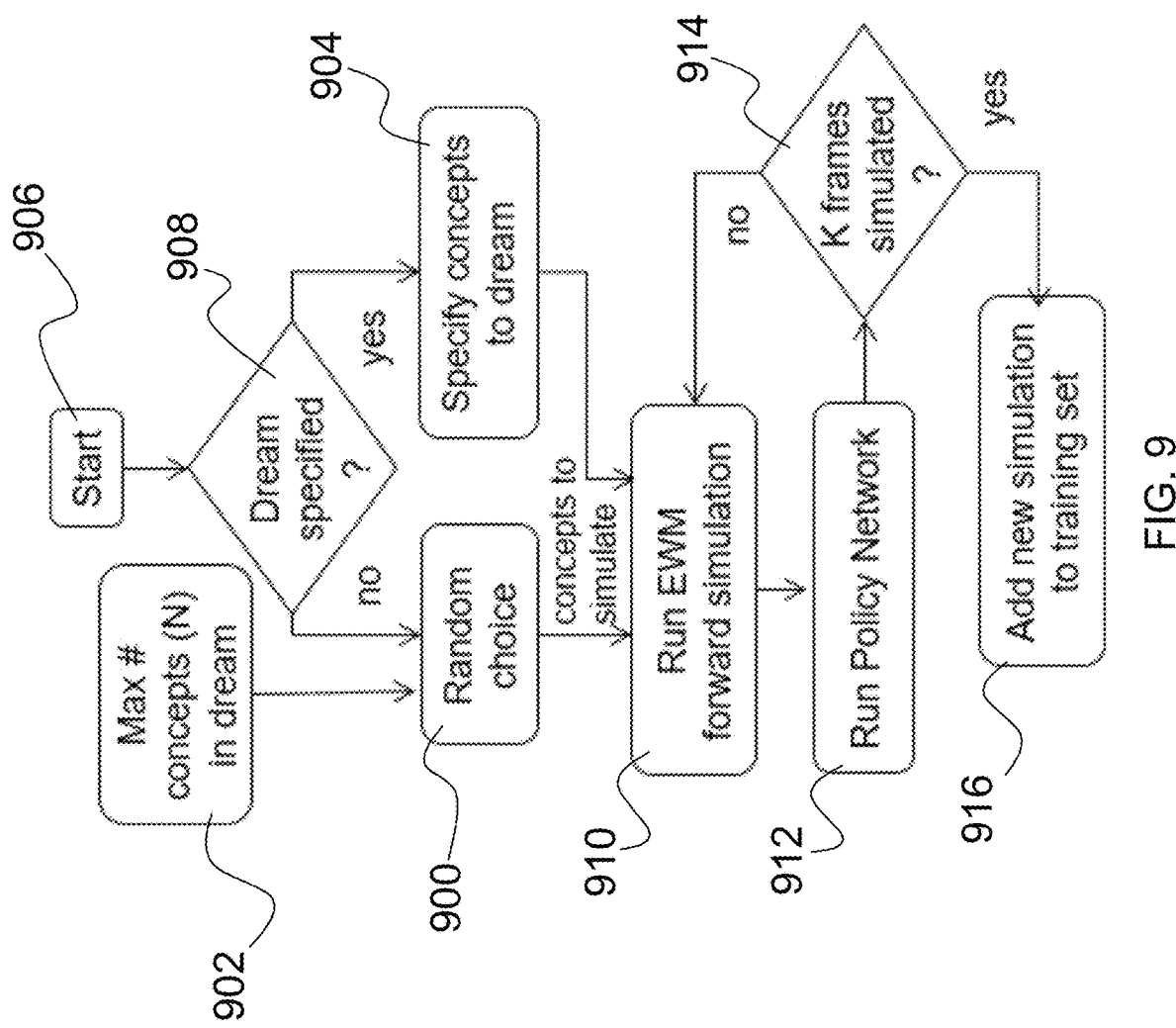
FIG. 9 is a flow diagram illustrating simulating concept constrained dreams according to some embodiments of the present disclosure.

FIG. 9 is a flow diagram that illustrates how subsets of stored concepts are chosen (either a random choice 900 of up to N concepts 902 or a user-specified subset of concepts 904) and K iterations (a fixed parameter) of a forward simulation are performed (see paragraph 00082), which is ultimately added to the training set used by the System Training 608 component. At start 906, the system determines if the dream is for a specified corner case 908. If yes, a set of concepts must be specified to be simulated based on which ones were activated in a given episode of the corner case 904. If not, the system described herein chooses up to N concepts at random 900. Either way, the Episodic World Model 402 component and the Policy Network 606 component perform K recursive forward simulations 910, 912, and 914, which creates a new "dreamed" simulation to be added to the training set 916 used to train the agent offline.

(3.6) System Training 608 Component

Finally, during offline periods, the set of generated dream sequences, or new forward simulations, is presented to the agent to make it more capable of handling novel experiences. The generated sequences are interleaved with real-world experiences during offline periods for continual learning without catastrophic forgetting. The multimodal decoders 614 convert the dream sequence into the sensor data format that the ML system 616 (e.g., vehicle) can learn from.

Figure 10:
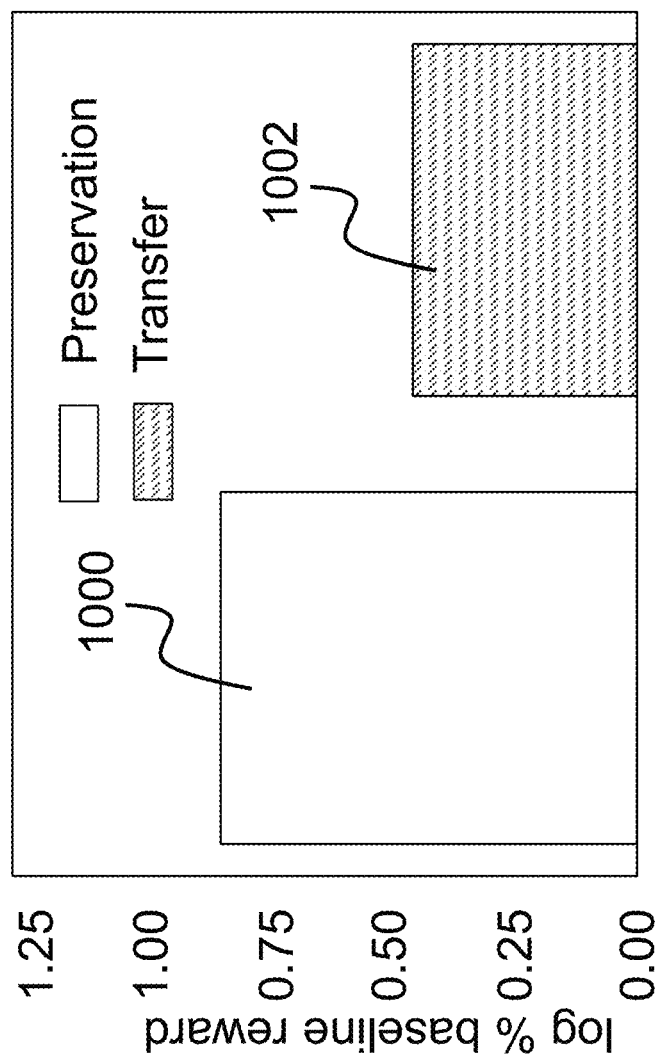
FIG. 10 illustrating results of a pilot study on preservation and transfer from offline simulations according to some embodiments of the present disclosure.

FIG. 10 illustrates results from a pilot study on preservation and transfer when current task learning is interleaved with offline simulations for previous tasks, according to some embodiments of the present invention. A ML system (agent) was sequentially trained on four variations of the Flappy Bird Atari game (different pipe placement, different pipe gap size, different pipe locations, different pipe width). Evaluations on previous (i.e., preservation 1000) and unseen (i.e., transfer 1002 (or adaptation)) tasks were compared with no offline learning. FIG. 10 shows that the episodic world model framework of the present invention is capable of both preservation 1000 of old knowledge, as well as transfer 1002 to new tasks when learning from dreams. In particular, results show that performance on old tasks was retained about 7.5 times better, and performance on new tasks due to just old experiences was about 2.5 times better compared to the baseline model (with no simulations interleaved). This indicates that the invention described herein has the potential to improve a ML system's simulation capabilities and improve its transfer to new situations by incorporating concepts into its learning.

The present invention is a practical method for augmenting a training set for a ML system so as to improve its robustness and resilience in the face of a complex and dynamic domain. It is an improvement to ML systems in many different domains, including autonomous land, air, or sea vehicles, as well as stock trading systems or planning systems of various kinds.

Concept constrained dreaming exceeds current approaches for greater than 10× improvement in data efficiency, as the approach according to embodiments of the present disclosure allows for generalization to specified and unspecified corner cases. This is based on the fact that random simulation can yield 10× efficiency in non-corner cases (see Literature Reference No. 10), and the method of targeted corner-case generation described herein can improve on this, and thus exceed existing approaches.

The invention described herein uses novel combinations of previously experienced concepts in order to train a ML system so that it can better deal with the appearance of these concepts that have never been experienced together before. Further, each novel combination of semantic concepts results in a large number stochastically simulated concrete instantiations of situations in which those concepts might co-occur. This transformation of a set of semantic concepts into concrete training samples is unexpected and unprecedented, resulting in a more robust ML system.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

The invention claimed is:

1. A system for generalization of an agent to unanticipated environmental changes, the system comprising:
one or more processors and a non-transitory computer-readable medium having executable instructions encoded thereon such that when executed, the one or more processors perform operations of:
extracting a set of concepts from an agent's experiences of an environment, the environment having associated semantics and dynamics;
consolidating the extracted set of concepts into an episodic world model;
generating, using the episodic world model, a dream sequence of prospective self-generated simulations based on a selected set of concepts and, the self-generated simulations being generated without sensor data and to respect the environment's semantics and dynamics by being constrained by the environment's semantics and dynamics;
converting the dream sequence into a format that a machine learning (ML) system can learn from; and
using the format of the dream sequence for augmented training of the agent to operate in the environment with the generalization to unanticipated changes in the environment.

2. The system as set forth in claim 1, wherein the set of concepts is randomly selected based on a pre-determined parameter for a number of concepts that constitute typical corner cases.

3. The system as set forth in claim 1, wherein the set of concepts is selected to match concepts activated by an episode of a corner case scenario.

4. The system as set forth in claim 1, wherein the one or more processors further perform operations of:
iterating through the agent's experiences of the environment and extracting a plurality of concepts;
when an extracted concept is a new concept, storing the new concept; and
training the episodic world model with the new concept.

5. The system as set forth in claim 1, wherein the one or more processors perform operations of:
determining if a dream has been specified,
wherein when the dream is specified, the set of concepts to be simulated is input by a user,
wherein when the dream is not specified, randomly selecting the set of concepts to be simulated;
performing, by the episodic world model, recursive forward simulations of the selected set of concepts to generate the dream sequence;
adding the dream sequence to a training set; and
training the agent offline with the training set.

6. The system as set forth in claim 1, wherein the agent is an autonomous vehicle.

7. A computer implemented method for generalization of an agent to unanticipated environmental changes, the method comprising an act of:

causing one or more processors to execute instructions encoded on a nontransitory computer-readable medium, such that upon execution, the one or more processors perform operations of:

extracting a set of concepts from an agent's experiences of an environment, the environment having associated semantics and dynamics;

consolidating the extracted set of concepts into an episodic world model;

generating, using the episodic world model, a dream sequence of prospective self-generated simulations based on a selected set of concepts, the self-generated simulations being generated without sensor data and to respect the environment's semantics and dynamics by being constrained by the environment's semantics and dynamics;

converting the dream sequence into a format that a machine learning (ML) system can learn from; and using the format of the dream sequence for augmented training of the agent to operate in the environment with the generalization to unanticipated changes in the environment.

8. The method as set forth in claim 7, wherein the set of concepts is randomly selected based on a pre-determined parameter for a number of concepts that constitute typical corner cases.

9. The method as set forth in claim 7, wherein the set of concepts is selected to match concepts activated by an episode of a corner case scenario.

10. The method as set forth in claim 7, wherein the one or more processors further perform operations of:

iterating through the agent's experiences of the environment and extracting a plurality of concepts;

when an extracted concept is a new concept, storing the new concept; and training the episodic world model with the new concept.

11. The method as set forth in claim 7, wherein the one or more processors perform operations of:

determining if a dream has been specified, wherein when the dream is specified, the set of concepts to be simulated is input by a user, wherein when the dream is not specified, randomly selecting the set of concepts to be simulated;

performing, by the episodic world model, recursive forward simulations of the selected set of concepts to generate the dream sequence;

adding the dream sequence to a training set; and training the agent offline with the training set.

12. The method as set forth in claim 7, wherein the agent is an autonomous vehicle.

13. A computer program product for generalization of an agent to unanticipated environmental changes, the computer program product comprising:

computer-readable instructions stored on a non-transitory computer-readable medium that are executable by a computer having one or more processors for causing the processor to perform operations of:

extracting a set of concepts from an agent's experiences of an environment, the environment having associated semantics and dynamics;

consolidating the extracted set of concepts into an episodic world model;

generating, using the episodic world model, a dream sequence of prospective self-generated simulations based on a selected set of concepts, the self-generated simulations being generated without sensor data and to respect the environment's semantics and dynamics by being constrained by the environment's semantics and dynamics;

converting the dream sequence into a format that a machine learning (ML) system can learn from; and using the format of the dream sequence for augmented training of the agent to operate in the environment with the generalization to unanticipated changes in the environment.

14. The computer program product as set forth in claim 13, wherein the set of concepts is randomly selected based on a pre-determined parameter for a number of concepts that constitute typical corner cases.

15. The computer program product as set forth in claim 13, wherein the set of concepts is selected to match concepts activated by an episode of a corner case scenario.

16. The computer program product as set forth in claim 13, wherein the one or more processors further perform operations of:

iterating through the agent's experiences of the environment and extracting a plurality of concepts;

when an extracted concept is a new concept, storing the new concept; and training the episodic world model with the new concept.

17. The computer program product as set forth in claim 13, wherein the one or more processors perform operations of:

determining if a dream has been specified, wherein when the dream is specified, the set of concepts to be simulated is input by a user, wherein when the dream is not specified, randomly selecting the set of concepts to be simulated;

performing, by the episodic world model, recursive forward simulations of the selected set of concepts to generate the dream sequence;

adding the dream sequence to a training set; and training the agent offline with the training set.

18. The computer program product as set forth in claim 13, wherein the agent is an autonomous vehicle.

* * * * *